(12) United States Patent
Chang

(10) Patent No.: US 6,996,790 B2
(45) Date of Patent: Feb. 7, 2006

(54) SYSTEM AND METHOD FOR GENERATING A TWO-DIMENSIONAL YIELD MAP FOR A FULL LAYOUT

(75) Inventor: Fang-Cheng Chang, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 300 days.

(21) Appl. No.: 10/354,382

(22) Filed: Jan. 30, 2003

(65) Prior Publication Data

US 2004/0153979 A1    Aug. 5, 2004

(51) Int. Cl.
*G06F 17/50* (2006.01)
*G06K 9/00* (2006.01)

(52) U.S. Cl. .............. 716/4; 716/19; 716/21; 703/13; 382/145

(58) Field of Classification Search ............... 716/1–2, 716/4–5, 19–21; 703/13–14; 700/121; 382/144–145
See application file for complete search history.

(56) References Cited

U.S. PATENT DOCUMENTS

| | | | |
|---|---|---|---|
| 4,481,664 A | | 11/1984 | Linger et al. |
| 5,754,432 A | | 5/1998 | Komatsuzaki et al. |
| 5,773,315 A | | 6/1998 | Jarvis |
| 5,978,501 A | | 11/1999 | Badger et al. |
| 6,044,208 A | | 3/2000 | Papadopoulou et al. |
| 6,128,403 A | * | 10/2000 | Ozaki ..................... 382/145 |
| 6,178,539 B1 | | 1/2001 | Papadopoulou et al. |
| 6,311,139 B1 | | 10/2001 | Kuroda et al. |
| 6,360,005 B1 | | 3/2002 | Aloni et al. |
| 6,393,602 B1 | * | 5/2002 | Atchison et al. ............ 716/4 |
| 6,408,219 B2 | * | 6/2002 | Lamey et al. ............ 700/110 |
| 6,453,452 B1 | * | 9/2002 | Chang et al. ................ 716/8 |
| 6,560,766 B2 | * | 5/2003 | Pierrat et al. .............. 716/19 |
| 6,687,895 B2 | * | 2/2004 | Zhang ...................... 716/19 |
| 6,757,645 B2 | * | 6/2004 | Chang et al. .............. 703/13 |

FOREIGN PATENT DOCUMENTS

EP    0 910 123 A1  *  4/1999

OTHER PUBLICATIONS

U.S. Appl. No. 09/676,400, filed Sep. 29, 2000, Pierrat.
Pati, Y.C., et al., "Phase-shifting masks for microlithography: automated design and mask requirements," J. Opt. Soc. Am. A. vol. 11, No. 9 (Sep. 1994), 2438-2452.
Pati, Y.C., et al., "Exploiting Structure in Fast Aerial Image Computation for Integrated Circuit Patterns," IEEE Transactions on Semiconductor Manufacturing, vol. 10, No. 1 (Feb. 1997) 62-73.

* cited by examiner

*Primary Examiner*—Leigh M. Garbowski
(74) *Attorney, Agent, or Firm*—Kenta Suzue Haynes Beffel & Wolfeld LLP

(57) ABSTRACT

A two-dimensional yield map for a device, such as an integrated circuit, in a fabrication facility is computed and associated with layout data for the device in a hierarchical and/or instance-based layout file. The device has a layout including a pattern characterizable by a combination of members of a set of basis shapes. A set of basis pre-images include yield map data representing an interaction of respective members of the set of basis shapes with a defect model. A yield map for the pattern is created by combining basis pre-images corresponding to basis shapes in the combination of members that characterize the pattern to provide a combination result. The output may be displayed as a two dimensional map to an engineer performing yield analysis, or otherwise processed.

47 Claims, 8 Drawing Sheets

```
T
{
    REF LIST AT_A, BT_B
}

A
{
```

```
    REF LIST CT_CA
}

B
{
```

```
}

C
{
```

```
}
```

SYSTEM AND METHOD FOR GENERATING A TWO-DIMENSIONAL YIELD MAP FOR A FULL LAYOUT

BACKGROUND OF THE INVENTION

1. Field of the Invention

The present invention relates to the design and manufacture of complex devices, including integrated circuits; and more particularly to estimation of manufacturing yield based upon layout design data and defect models.

2. Description of Related Art

Manufacturing yield is a measure of the number of defective devices made during a manufacturing process which also yields good devices. Improvements in manufacturing yield lead to increases in manufacturing efficiency and reduced costs. In the integrated circuit manufacturing, yields are affected by so-called extra material defects caused by foreign particles, like dust, which settle on a layer of the device, and cause short circuits, open circuits, or other types of defects in the devices being manufactured. Defects can also be caused by missing material, and other things.

In the design of complex devices like integrated circuits, it is desirable to predict the yield of the device under design, so that design improvements may be made if needed to improve the yield. Background concerning yield prediction procedures is found in U.S. Pat. No. 6,178,539 B1, which is incorporated by reference as if fully set forth herein.

Because designs for integrated circuits are so complex, yield predictions are typically made for very localized or isolated portions of the layout. Using these portions, a yield curve as a function of defect size is calculated to model device failure rates given defect size, distribution and density. Sometimes, a two-dimensional equivalent yield map is produced for a small portion of a layout, which characterizes the yield by mapping locations on the layout having structures that have higher probability of suffering defects that affect yield. The two-dimensional calculation is very expensive in terms of computational resources, even for small areas. Two-dimensional calculations for the entire layout of a full chip are impractical using reasonably available computers.

Accordingly, there is a need for a method and system for two-dimensional yield map calculation that can be practically applied to large layouts, including full-chip layouts in integrated circuit design.

SUMMARY OF THE INVENTION

The present invention provides a method and system applying a fast algorithm for two-dimensional yield map calculation, and extends yield map computation using hierarchical management of layout data to generation of full-chip yield maps within reach of practical computer systems.

A method according to the present invention provides an estimate of yield for a device, such as an integrated circuit, in a fabrication facility. The device has a layout including a pattern, or a plurality of patterns, characterizable by a combination of members of a set of basis shapes. A set of basis pre-images is provided in a machine-readable storage medium. The basis pre-images include localized yield map data, representing, for example, an interaction of respective members of the set of basis shapes with a defect model. Yield map data is produced by one or more techniques, including linear or non-linear combinations of convolutions or linear operations. Both theoretical and empirical techniques may be used to provide yield map data. Basis pre-images in one embodiment comprise the results of convolution, or of some mapping of convolution(s), of a function representing the defect model with a function representing the respective basis shapes. A yield map for the pattern is created by reading and combining basis pre-images corresponding to the basis shapes in the combination of members that characterize the pattern. In some embodiments, pattern used for the yield map computation is automatically extracted from the layout file. The combination result is provided as output, in the form of a two-dimensional yield map for the pattern. The output may be displayed to an engineer performing yield analysis, or otherwise processed.

In embodiments in which the layout includes a plurality of such patterns, pattern yield maps are generated for each of the patterns in the plurality, and combined to provide a yield map for the layout. In some embodiments, the layout characterizes a complete layer of an integrated circuit, and the present invention enables generation of full chip two-dimensional yield maps. Thus, yield maps for layout patterns can be computed in reasonable amount of time, and then pattern yield maps can be combined to characterize yield maps for large complex layouts for devices such as integrated circuit modules or complete integrated circuits.

According to yet another embodiment, the present invention provides a library of basis pre-images. The basis pre-images in the library comprise yield map data for corresponding basis shapes utilized to characterize a layout. In the process of calculating a yield map, the algorithm includes determining for a particular basis shape in the combination of basis shapes that characterize the pattern in the layout, whether a basis pre-image corresponding to the particular basis shape is included in the library. If the particular basis shape is not included in the library, then a new basis pre-image is computed in response to the defect model and the particular basis shape. The new basis shape has been added to the library for subsequent use.

In some embodiments of the invention, for which the pattern is automatically extracted, patterns to be subject of the yield map analysis are identified by accessing a particular layout feature in the layout from the layout file and defining a halo region around the layout feature. A halo region as an inner parameter defined for example by the outer perimeter of the particular layout feature. The outer perimeter of the halo is spaced away from the inner parameter by a distance related to the defect model in use. The process determines whether another layout feature in the layout file intersects the halo region. If another layout feature intersects the layout region, then a combination including the particular layout feature and the other feature is provided as said pattern for yield analysis.

Using two-dimensional yield maps for patterns of a complex layout in association with instance-based or hierarchical layout files significantly increases the efficiency of yield map computation. Thus, in one embodiment of the invention, a method for providing an estimate of yield for a device characterized by an instance-based or hierarchical layout file includes associating with nodes in the instance-based or hierarchical layout file, two-dimensional yield maps for the layout patterns corresponding to the nodes. A layout for a complete layer of an integrated circuit, or a complete layer of a complex module of an integrated circuit design, is generated by collapsing the layout file.

In processing the layout file for generation of a yield map, in some embodiments of the invention, a node in the layout file for a particular layout pattern is accessed, where the particular pattern includes a layout feature. A halo region is defined around the layout feature, as described above. For the layout pattern, the process determines whether a layout pattern in a sibling node or other node in the layout file intersects with a halo region. If an intersecting layout region from another node in the layout file is found, then the yield map associated with the first node is modified based upon interactions with the other layout pattern. In instance-based layouts, a new instance of the node may be created if there are no other nodes already existing having the same interactions.

Embodiments of the invention include the library of basis pre-images. The basis pre-images in the library comprise yield map data for a subset of the set of basis shapes, including some or all of the basis shapes in the combination of members.

The invention is embodied by data processing methods, data processing systems adapted for implementation of the methods, and articles of manufacture that comprise computer readable data storage media holding computer programs that include logic for implementation of the methods.

Other aspects and advantages of the present invention can be seen on review of the drawings, the detailed description and the claims, which follow.

DETAILED DESCRIPTION

Figure 1:
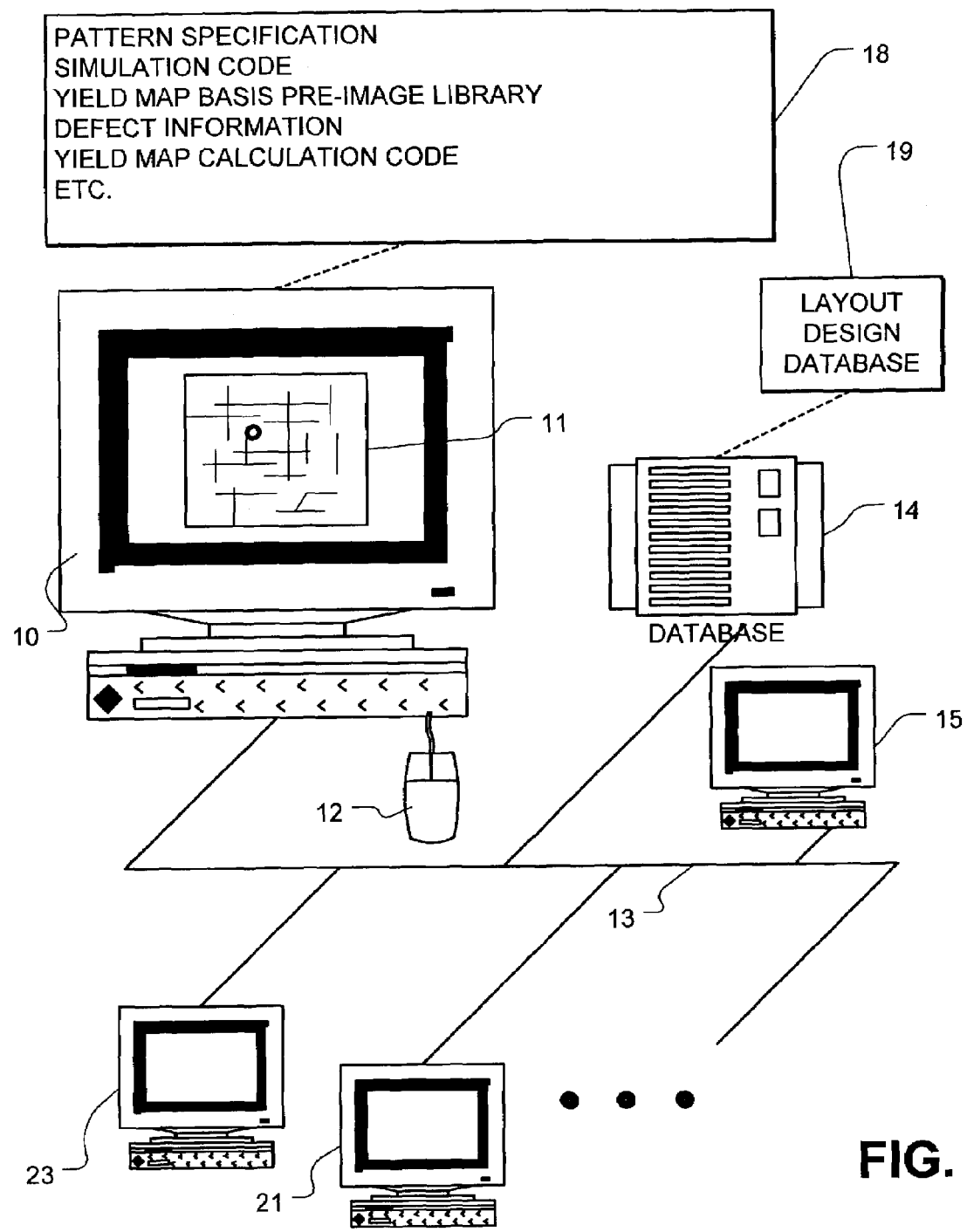
FIG. 1 illustrates a data processing system including resources for generating a full-chip, two-dimensional yield map according to the present invention.

A detailed description of embodiments of the present invention is provided with reference to FIGS. 1–10. FIG. 1 schematically illustrates a data processing system, including workstations 10, 15, 21 and 23 and database storage system 14, executing programs of instruction, implemented with features of the present invention. The workstations 10, 15, 21 and 23 and other data processing resources including database storage system 14 are coupled to the network 13.

One or more of the workstations 10, 15, 21 and 23 include resources which execute programs of instruction in support of the yield map computation and analysis process of the present invention. In a preferred system, the system supports yield map calculation in support of the design and manufacturing of integrated circuits. In other embodiments, the system supports yield map calculation in support of the design and manufacturing of lithographic masks used in integrated circuit manufacturing.

Components of the system shown in FIG. 1 are interconnected by a communication network 13. The workstation 10 in this embodiment includes a display on which a graphical user interface 11 is presented, an input device, such as a keyboard (not shown) and a mouse 12, by which a user interacts with the graphical user interface 11. In this embodiment, the graphical user interface 111 displays a representation, retrieved from the database 14 or simulated in the data processing system using layout data and simulation code, of a portion of the device for which yield analysis is to be performed. The user manipulates a pointer with the mouse 12 or otherwise, for selecting features in the displayed representation, as an aid in the yield analysis process.

Also, the database storage system 14 is coupled to the network 13, and stores a layout design database 19 for use by data processing equipment on the network 13, including workstation 10. The layout design database in system 14 is organized as an instance-based, hierarchical database in some embodiments, and is a layout database organized in other ways in other embodiments as suits the needs of a particular system. Workstation 10 includes, or has access to, memory (schematically18) storing data programs for execution, including pattern specification data, simulation code, a yield map basis pre-image library, defect models based on information about defects affecting yield, two-dimensional yield map calculation code, and other processes including graphical user interface modules. Additional workstations 15, 21, 23 are coupled to the network 13, and are used in parallel with the workstation 10, or used for other processes associated with design and yield estimation, including for example, hierarchy management as described in commonly owned, co-pending U.S. patent application Ser. No. 10/30 1,225, entitled Automated Creation of Metrology Recipes, invented by Fang-Cheng Chang, filed Nov. 21, 2002, which is incorporated by reference as if fully set forth herein. Another example of processes associated with design and yield estimation which is executed in the workstations in the network 13 is aerial image simulation, such as described by Pati, et al., *Exploiting Structure in Fast Aerial Image Computation for Integrated Circuit Patterns*, IEEE Transactions on Semiconductor Manufacturing, Vol. 10, No. 1, February 1997.

Figure 2:
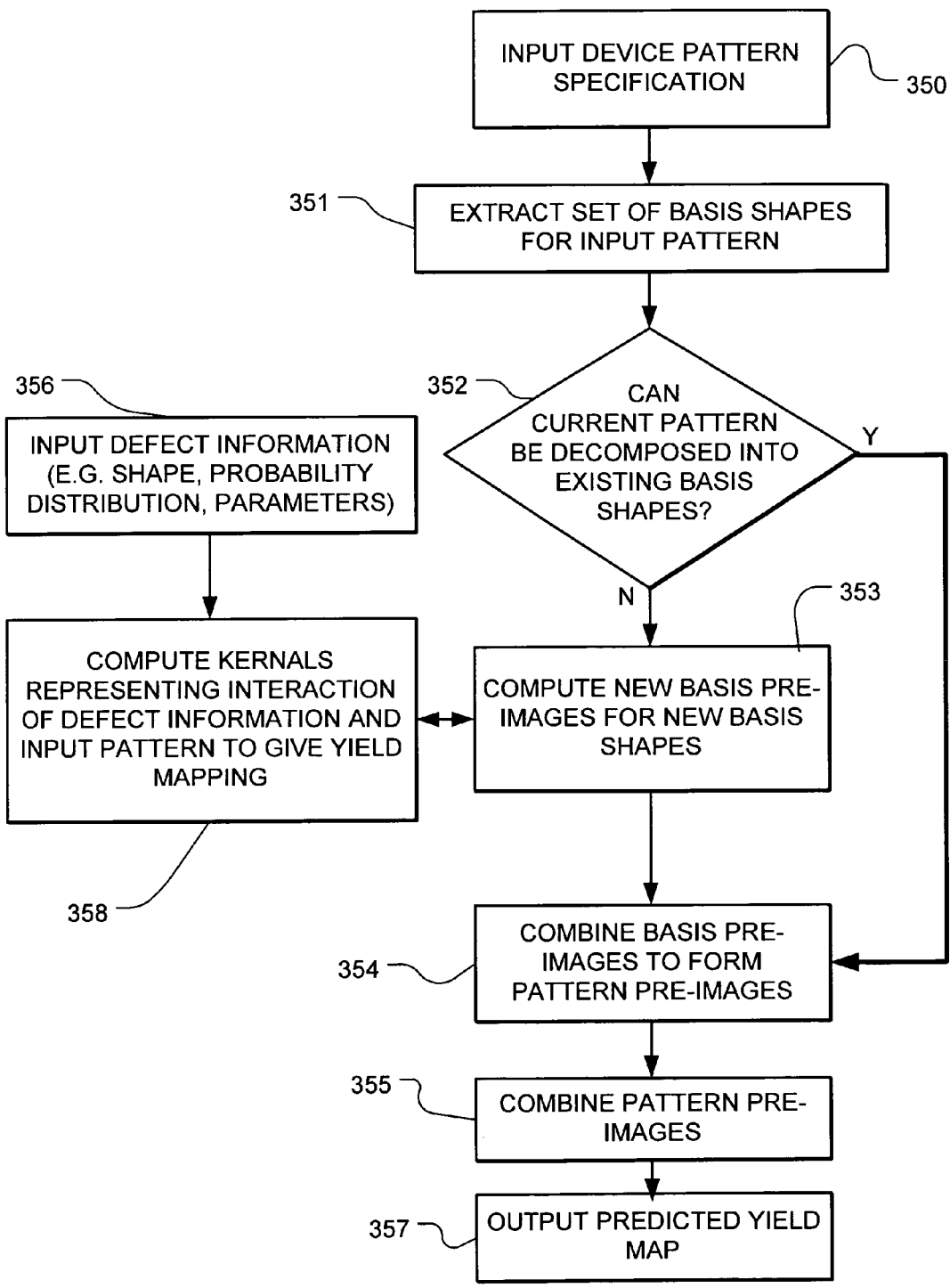
FIG. 2 is flow chart of a computer-implemented algorithm for generating a two-dimensional yield map for a complex layout according to the present invention.

FIG. 2 illustrates a basic yield map calculation algorithm according to the present invention. An input to the process is the device pattern specification (block 350). The device pattern specification defines the layout that includes a pattern which can be characterized by a combination of members of a finite set of basis shapes. The basis shapes in the finite set are building blocks or basis functions that can be used to represent the pattern. As described in Pati, et al., referred to above, integrated circuit patterns are often are defined by Manhattan geometry shapes which are characterized by shapes having edges parallel to one of the coordinate axes in a rectangular coordinate system. Such patterns can be specified as the union of non-overlapping rectangles. The edges of the rectangles lie on a known and fixed grid such as specified by CIF database units. Furthermore, typically there only exist a "small" number of different widths of boxes in each pattern, where the width of the box can be taken as the smaller of its two-edged dimensions. Deviations from the Manhattan geometry, including layouts which have shapes with edges lying along lines at a limited number of angles relative to the coordinate axes, are handled using techniques similar to those described herein.

As mentioned with respect to FIG. 1, a yield map basis pre-image library is computed and stored in memory 18 of the data processing system. The yield map basis pre-image library includes a set of basis pre-images, where members of the set of basis pre-images comprise yield map data representing an interaction of a respective basis shape and defect models based on defect information, such as a mathematical defect model. For example, the yield map data can potentially be computed by a convolution F*D, or sequences or combinations of convolutions, of a first two-dimensional function F characterizing the basis shape, and a second two-dimensional function D characterizing a defect model based on one or more of defect size, defect probability distribution, defect shape and other information about the defects being considered in the analysis. In useful systems, the defect model based on the defect information consists of a simple circular defect shape having a radius of interest to the defect analysis. In other systems, the defect model consists of a distribution of defect sizes, and in other systems, the defect model comprises a probability distribution over defect size and defect type. The yield map data may comprise empirical data alone in sound systems, or empirical data combined with data based on theoretical models. Thus, defect model utilized according to the present invention can be simple or complex as suits the needs of this particular embodiment. In addition, localized yield map data may be provided using more than one defect model, combined using linear or non-linear functions.

Continuing with the procedure shown in FIG. 2, from the input device pattern specification, the combination of members of the set of basis shapes which characterizes the input pattern is extracted (block 351). Next, it is determined whether the combination of members of the set of basis shapes that define the input pattern can be decomposed into a set of basis shapes for which yield map basis pre-images already been computed and stored in a yield map basis pre-image library (block 352). If the combination of basis shapes that characterize the input pattern is already available in a basis pre-image library, the process branches to step 354. If basis shapes in the combination of basis shapes that characterize the input pattern do not have corresponding entries in the basis pre-image library, then new basis pre-images are computed for the new basis shapes (block 353). The computation of new basis pre-images is represented by the process beginning block 356, where defect information is provided as input, where representative defect information includes parameters characterizing defect shape, defect probability distribution, and other defect characteristics that relate to a yield calculation. The defect information is utilized to compute kernels that represent interaction of a defect model and the new basis shape from the input pattern in order to generate a yield mapping in the form of a new yield map basis pre-image for the new basis shape, which can be added as a new entry in library (block 358). After block 353, the process proceeds to block 354. At block 354, the yield map basis pre-images which correspond to the basis shapes characterizing the pattern are read from the library and combined using a data processing system (block 354). Typically, this process is applied to patterns that characterize a portion of the input integrated circuit, so that the combination result at step 354 can be characterized as a pattern pre-image. Once all the pattern pre-images for the integrated circuit layout have been computed, the pattern pre-images are combined (block 355). The combination result at block 355 comprises a two-dimensional yield map for the entire device pattern specification for large input pattern specification, including a full chip pattern specification. The result is provided as computer readable and/or human-readable output in a final step (block 357).

Figure 3:
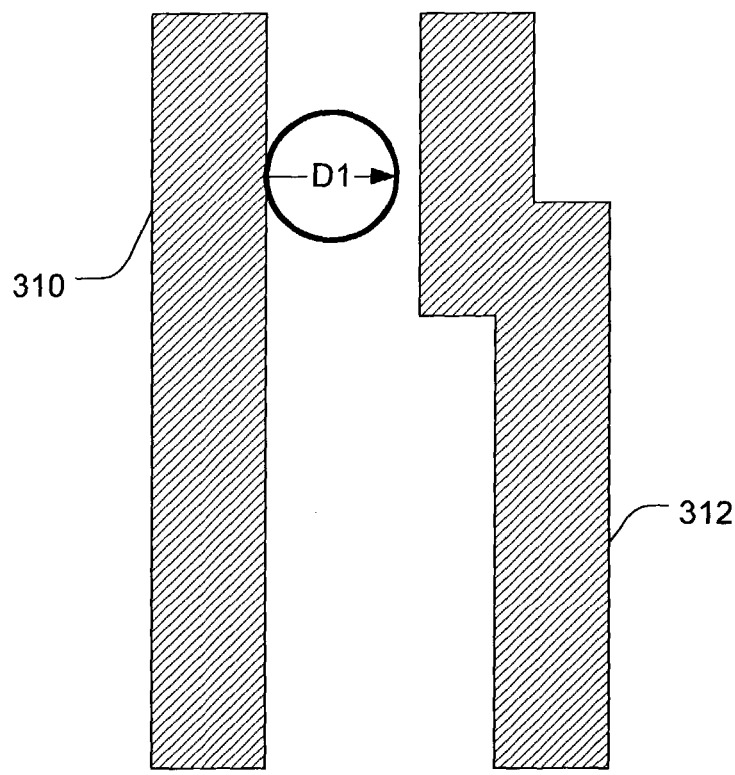
FIGS. 3 and 4 illustrate a yield map "halo" for identifying patterns in a layout critical for a yield map computation.
Figure 4:
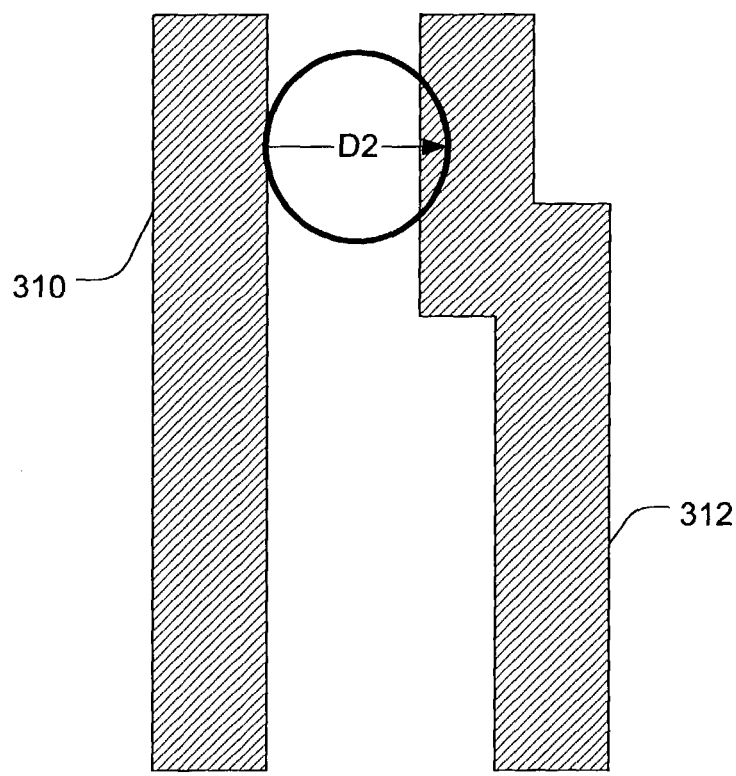

As illustrated with reference to FIGS. 3 and 4, to further simplify yield map computation, a yield map analysis halo is designated around features in the layout such as representative feature 310. Yield map analysis halo can be characterized by an imaginary line that lies extends a distance "d" from, and parallel to, each edge of representative feature 310. For, example, the halo in FIG. 3 can be characterized by moving the circle of diameter D1 along the edges of the feature 310. Distance "d" represents a "maximum defect size" and is selected so that any features outside analysis halo will have a negligible effect on yield based on interaction of the defect model with representative feature 310. Note that the outer perimeter of defect analysis halo would have rounded corners if defined as described above, and would maintain a completely constant spacing from feature 310. However, square corners are used in alternative approaches; are simpler to define and process; and do not occupy a significantly larger area of the layout. As shown in FIG. 4, a larger distance "d" such as represented by moving the circle of diameter D2 along the edges of the feature 310 yield a larger halo which intersects with the feature 312. Thus, a pattern comprising the features 310 and 312 would be utilized for the purposes of the yield map computation for a halo size based on the circle of diameter D2.

Accordingly, representative feature 310 and yield map analysis halo form a yield analysis zone. The yield analysis zone is used as input to the yield map computation unit, to specify the patterns to be used in the process of FIG. 2, so that a yield map for the zone or a set of related zones, corresponds with a pattern pre-image as computed in block 354.

As described previously, distance "d" is selected such that interaction with any potential feature which could have a significant effect on yield for a given defect model will be included in analysis halo. The analysis halo would typically not incorporate all features that could introduce any probability of failure of the device. Such a comprehensive approach would generally be undesirable, because probabilities of failure of IC elements below a certain level would not provide much benefit to the yield map calculation, but would require an excessively large yield analysis halo. This approach, in turn, would tend to negate the efficiency benefits derived from applying yield analysis zones to the yield map computation. Therefore, the yield analysis range should be selected, either empirically or based on engineering or theoretical models, to encompass only those features that could have an effect on yield above a certain threshold for a given defect model.

Figure 5:
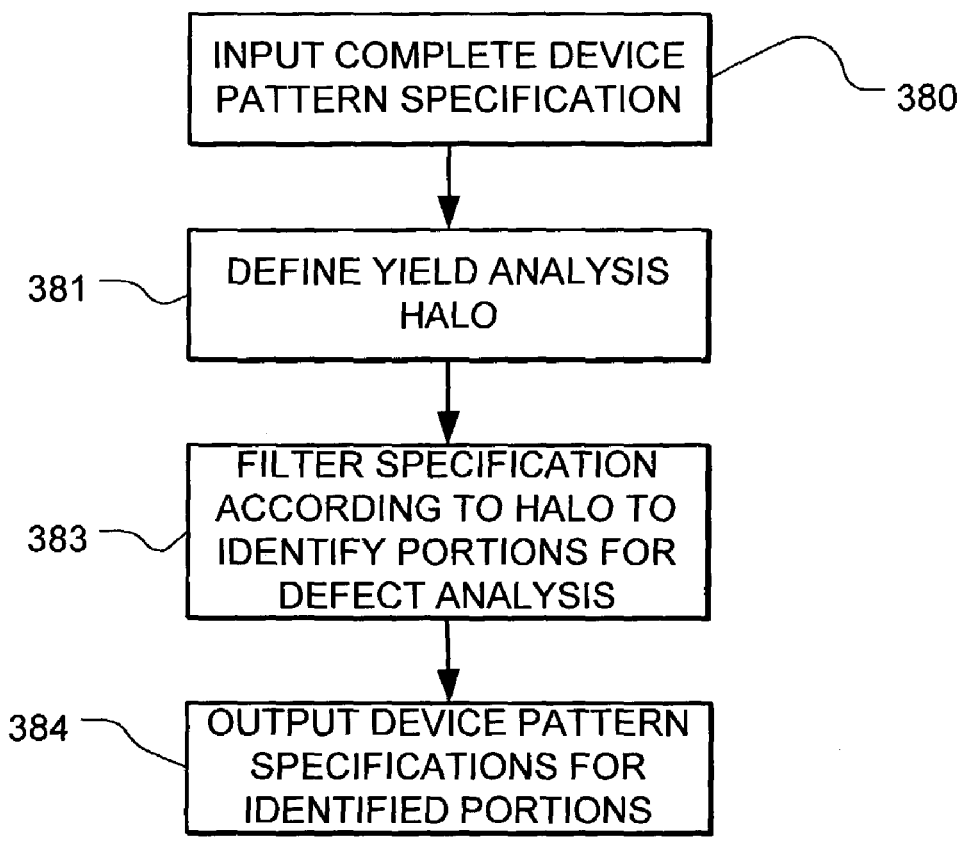
FIG. 5 is a flow chart of a computer-implemented method for identifying patterns in a layout critical for a yield map computation using a yield map halo.

FIG. 5 illustrates the basic flowchart applying the yield analysis halo. Thus, a complete device pattern specification is input at block 380. A yield analysis halo is defined (block 381). The complete device specification is filtered according to the halo to identify portions for yield analysis (block 383). Device pattern specifications for the identified portions are output as patterns for use in the algorithm of FIG. 2 (block 384).

Figure 6:
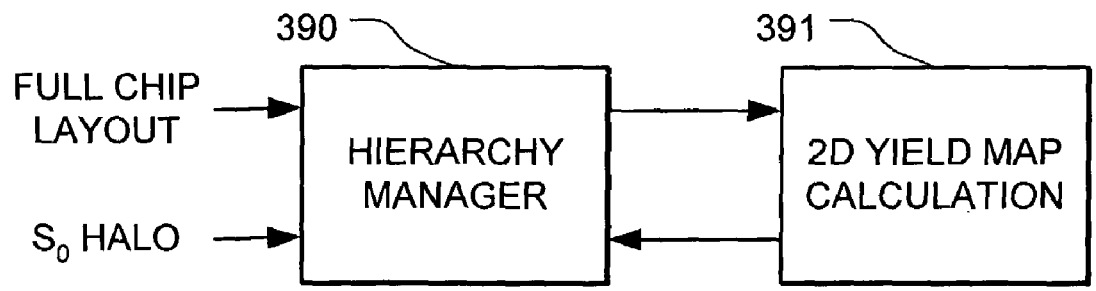
FIG. 6 illustrates a system for application of yield map calculations with hierarchical management of layout data.

As illustrated in FIG. 6, the yield map calculation technology of the present invention is extended to hierarchical pattern specifications, including instance-based pattern specifications, in which for a given instance of a shape in the layout, a single representation of the shape is stored, and references to the single representation are provided in a hierarchical data structure characterizing the layout. Thus, a full chip layout is provided to a hierarchy manager 390, as well as the hierarchy management information including a halo specification. In this example, localized yield maps are provided by a two-dimensional yield map calculation (block 391) computed over patterns identified using the halo specification. The process of management of the hierarchy that specifies the complete device is an iterative process, and allows for full chip yield map calculation using practical data processing systems. Generally, a hierarchical layout database is annotated with localized yield maps for nodes in the hierarchy. The hierarchical layout database is instance-based in some embodiments. The localized yield maps can be obtained by any technique or from any source as suits a particular embodiment.

FIGS. 7A–7D illustrate application of the halo process, or similar process for accounting for interactions between patterns in the layout, to an instance-based hierarchical database specifying an integrated circuit design. An instance-based representation is a hierarchical design representation that is designed to allow parallel processing of a design hierarchy. In some embodiments, this is accomplished by restructuring the (or alternatively creating a new) hierarchical layout into a format in which the hierarchy information is separated from the geometrical shapes (and other information). Further, in the instance-based representation, the geometrical shapes and information may be stored as instances. Each instance in the instance-based representation (sometimes referred to as a physical cell) includes geometry information from the original cell (sometimes referred to as the actual cell) together with associated environment (e.g. structures within a halo, certain proximity, or interaction range of the cell).

Once a hierarchical design is processed into an instance-based representation it is possible to perform tasks in parallel on the instance cells. That is because each instance cell includes the necessary information about the relevant neighboring (in a physical/geometrical sense) structures in the layout. Further, if care is taken while instances are created to identify locations where a particular cell has similar interactions with neighboring layout geometries and structures, the number of instances created can be reduced. For example, if there is an instance in the instance-based representation where a cell C is interacting with a geometry from cell B as well as a geometry from cell A in a particular fashion, other locations where C has the same type of proximity interaction with the same geometries can be represented as a single instance.

The term instance thus has two meanings, the applicable one should be apparent from use. To repeat, in the context of a standard hierarchical layout, or non-instance-based representation, an instance is a particular cell (e.g. its geometry, contained cells, and/or other information, e.g. connectivity information, netlist information and/or information on coloring schemes). Thus if a standard hierarchical layout includes five instances of a cell C, then the cell C appears five times (at various rotations, orientations, positions, etc.) within the layout. In contrast, in an instance-based representation, an instance refers to a specific environment for a given cell. For example, when a given instance-based representation has two instances of a cell, e.g. the instance cell CP, that means there are two locations where a cell C has identical interactions with nearby geometries.

Figure 7A:
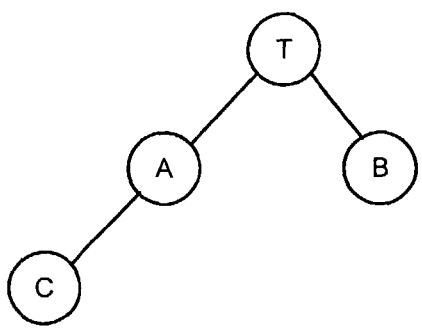
FIG. 7A illustrates a hierarchical representation of a layout in nodal form.
Figure 7B:
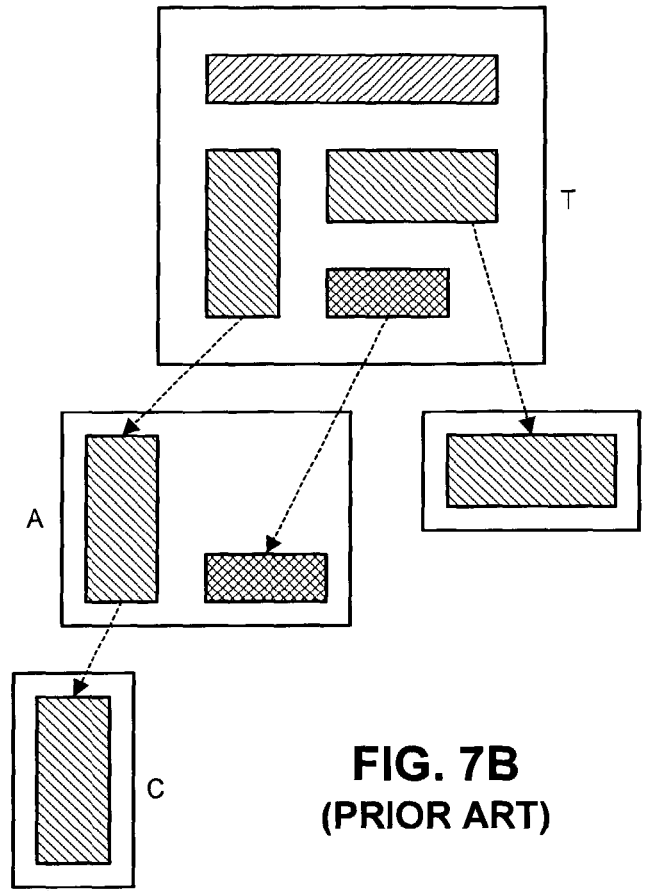
FIG. 7B illustrates a hierarchical representation of the layout in graphical form.
Figure 7C:
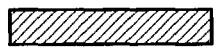
FIG. 7C illustrates a hierarchical representation of the layout in code form.
Figure 7C:
Figure 7C:
Figure 7D:
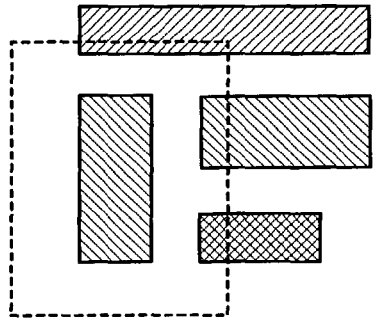
FIG. 7D illustrates an instance cell from an instance-based representation of the layout of FIG. 7A.

Returning to the layout shown in FIGS. 7A–7C, consider the instance of cell C (shown visually in FIG. 7B). Note that only the geometry of the single shape within C is available within the cell in the standard hierarchical layout. Contrast the standard cell with the instance-based representation shown in FIG. 7D as instance cell CP. Here, the interaction range of the cell CP is shown as a dotted line, and corresponds for example to the yield halo described above. Note that the portions of nearby geometries within T that interact with the geometries within cell C are included inside the boundary of the instance cell. More particularly, a portion of the geometry in T, a portion of cell B and a portion of geometry from within cell A are included within instance cell CP.

The instance cells can either directly store the geometrical information about the interacting geometries (e.g. the small rectangles for the portions of the three structures within the dotted lines) or can store references to the relevant geometric shapes themselves together with information about the relevant portions of those shapes that interact with cell C in this particular instance, CP. Also, according to the present invention, the instance cells include yield map pre-images or references to yield map pre-images as described above.

Figure 8A:
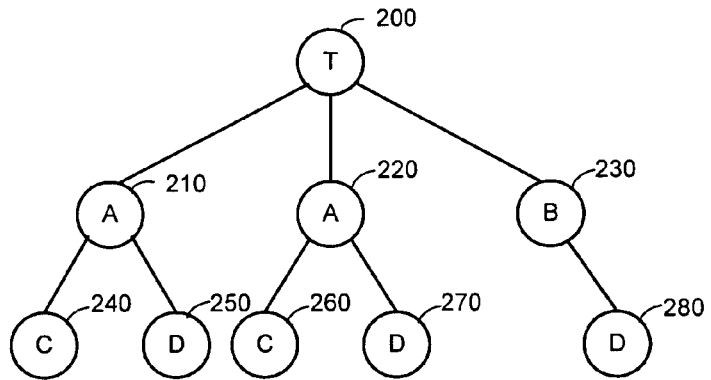
FIG. 8A illustrates a design hierarchy for a layout.
Figure 9:
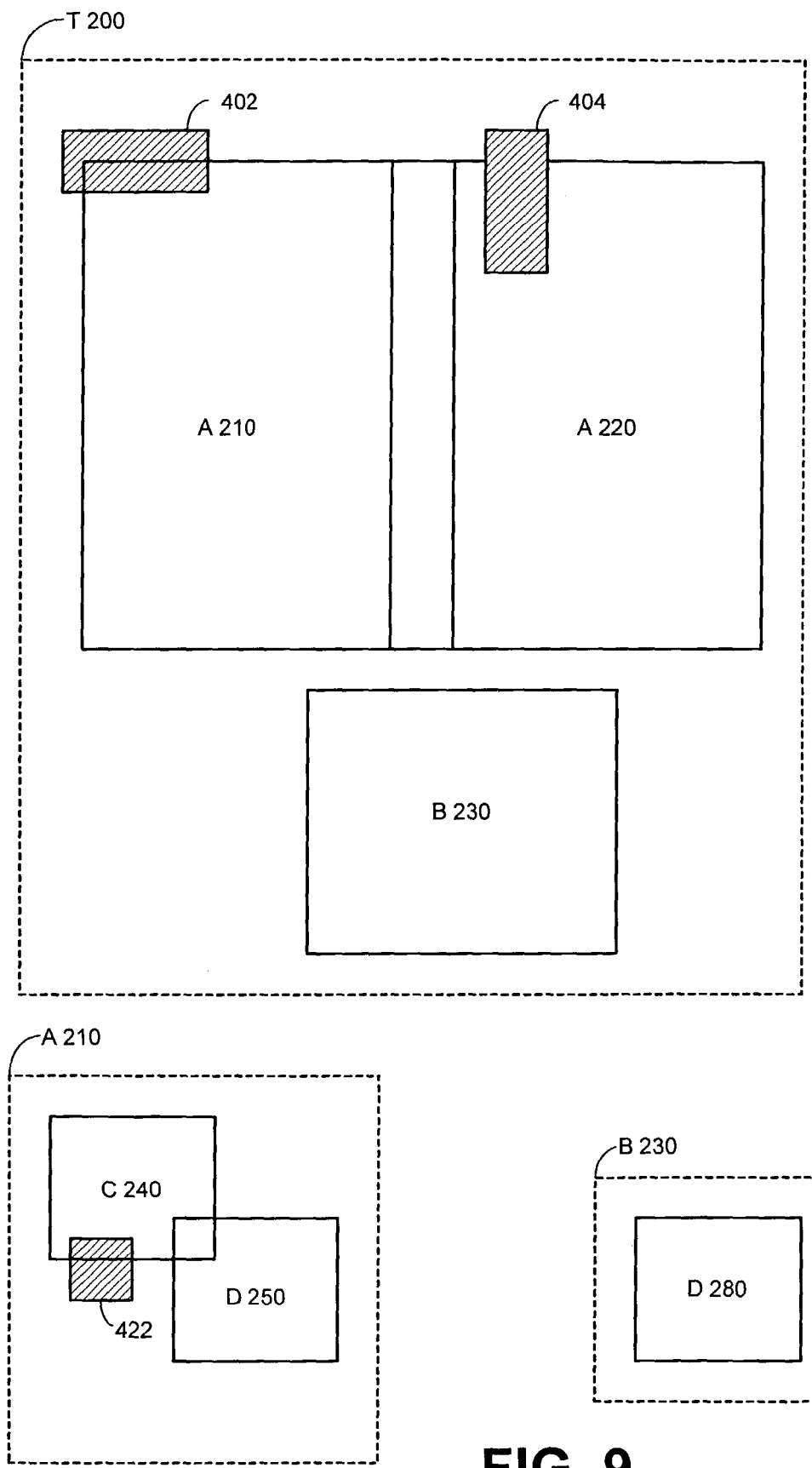
FIG. 9 presents an example of a hierarchical layout in accordance with an embodiment of the invention.

FIG. 8A illustrates an exemplary design hierarchy for a layout T 200, a visual depiction of the layout T 200 is shown in FIG. 9, see below. Layout T 200 includes two instances of the cell A, 210 and 220, as well as an instance of cell B 230. The first instance of the cell A 210 includes an instance of the cell C 240 and an instance of the cell D 250. Similarly, the second instance of the cell A includes an instance of the cell C 260 and an instance of the cell D 270. Cell B 230 includes an instance of the cell D 280.

Figure 8B:
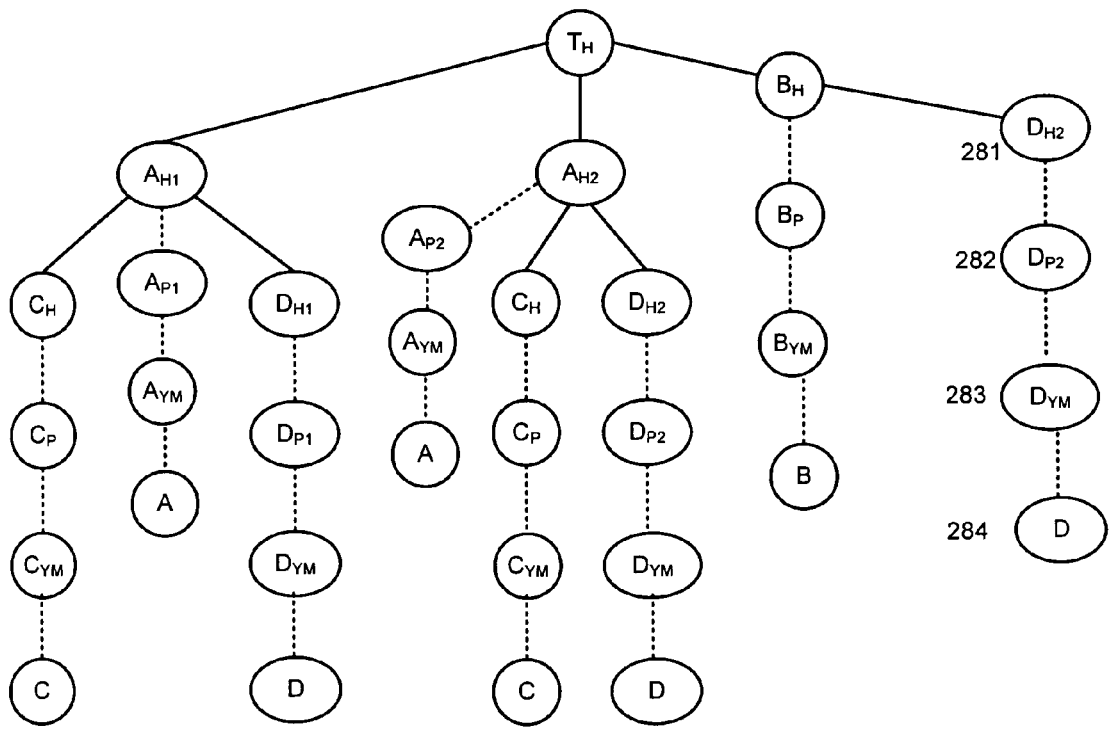
FIG. 8B illustrates a modified design hierarchy for the layout in accordance with an embodiment of the invention.

FIG. 8B illustrates a modified design hierarchy for the same layout T 200 in accordance with an embodiment of the invention. It is convenient to use this modified representation in generating the instance-based representation of the layout because the modified representation allows each node to encapsulate environmental information from its parent node as well as neighboring nodes.

This modified hierarchy can be generated by replacing each node in the original hierarchical representation (as illustrated in FIG. 8A) with three nodes. These three nodes includes a holding cell, a physical cell and an actual cell. The holding cell acts as a placeholder for the original cell. The physical cell contains information on environmental factors from a parent node or neighboring nodes that affect the node. For example, these environmental factors can include, geometries, connectivity information, netlist information and/or information on coloring schemes. Note that the term "coloring" refers to the process of marking phase shifting regions of a mask with different "colors" to differentiate different phase regions that are used to produce features through destructive light interference. A "coloring conflict" occurs when two differently colored regions become too close to each other, thereby causing unintentional destructive interference.

The physical cell also specifies areas of interest, e.g. the shapes and geometries upon which the relevant operations are to be performed. An interaction range for a cell covers an area surrounding the cell that must be examined for features that can interact with features defined within the cell. For example, for optical proximity correction (OPC) and phase shifting mask (PSM) production an interaction range (or halo) around the cell of approximately 1–2 $\mu$m is used. For yield analysis, the interaction range can be computed using a halo as described above. Note that as the wavelength of light ($\lambda$) and sizes of structures being used decreases, the size of the halo/interaction range can change. Thus, the halo may decrease below 1 $\mu$m. More specifically, in one embodiment when rules based OPC is performed the interaction range used is 1 $\mu$m while for model based OPC the interaction range used is 2 $\mu$m, and the range for yield analysis is yet another value.

Finally, the actual cell can include the original cell. For example in FIG. 8A, cell D 280 is replaced by a holding cell DH2 281, a physical cell DP2 282, a yield map cell DYM 283 and an actual cell D 284.

As noted, it is generally the case that in an instance-based representation, the hierarchy information is separated from other information (thus the holding or hierarchy cells). A consequence of this arrangement is that in the hierarchy an instance cell (or physical cell) will not point to other physical cells. However, in some cases it may be convenient to merge a holding and physical cell into a single cell to reduce the number of nodes in the tree. This can be done where the hierarchy contains only a single cell, e.g. DH2 281 and DP2 282 in FIG. 8B.

FIG. 9 presents an example of a hierarchical layout in accordance with an embodiment of the invention. This layout is a graphical representation of the layout illustrated in FIG. 8A. Within FIG. 9, a layout T 200 includes two instances of the cell A, 210 and 220, as well as an instance of the cell B 230. The first instance of the cell A 210 includes an instance of the cell C 240 and an instance of the cell D 250. The second instance of cell A 220 includes an instance of the cell C 260 (not shown in FIG. 9) and an instance of the cell D 270 (not shown in FIG. 9). Cell B 230 also includes an instance of the cell D 280.

In this graphical representation, layout T 200 includes two geometrical features 402 and 404 in addition to cells A 210, A 220 and B 230. Note that geometrical feature 402 affects the yield map of cell A 210, and that geometrical feature 404 affects the yield map of cell A 220. Also note that cell A 210 may affect the yield map of neighboring cell A 220. Similarly, cell A 220 may affect the yield map of neighboring cell A 210.

Consequently the system creates two instances of cell A. The first instance A 210 includes the yield map effects of geometrical feature 402 and neighboring cell A 220. The second instance A 220 includes the yield map effects of geometrical feature 404 and neighboring cell A 210.

The definition of cell A 210, which appears at the bottom of FIG. 9, includes cells C 240 and D 250 in addition to geometrical feature 422. Note that geometrical feature 422 affects the yield map of cell C 240. Furthermore, cell C 240 can affect the yield map of neighboring cell D 250, and cell D 250 can affect the yield map of neighboring cell C 240. This causes the system to create an instance of the cell C 240 that includes the yield map effects of geometrical feature 422 and neighboring cell D 250. This is the only instance created for cell C 240 because the other instance of cell C 260 under cell A 220 is the same as the instance of cell C 240 under cell A 210. The system also creates an instance of the cell D 250 that includes the effects of neighboring cell C 240.

Note that the definition of cell B 230 includes an instance of cell D 280, and this instance of cell D 280 is not affected by neighboring nodes or geometrical features defined within cell B 230. Hence, the system creates a second instance of cell D 280 that includes no effects from neighboring cells or geometrical features.

Moreover, note that it may be possible for factors that affect cell A to also affect cells C and D. For example, if geometrical feature 402 were to overlap cell C 240 (not shown), another instance of cell C 240, which includes the effects of geometrical feature 402, may have to be created. Hence, for these embodiments, it is important to create all instances of parent cell A before creating instances of a child cells C and D because the different instances of the parent cell A may create additional instances of the child cells C and D.

Note that by using an instance-based representation, a computational task can be easily partitioned so that different instances are processed by different threads. This facilitates parallel processing and/or pipelined execution for computational tasks, such as optical proximity correction and design rule checking.

Figure 10:
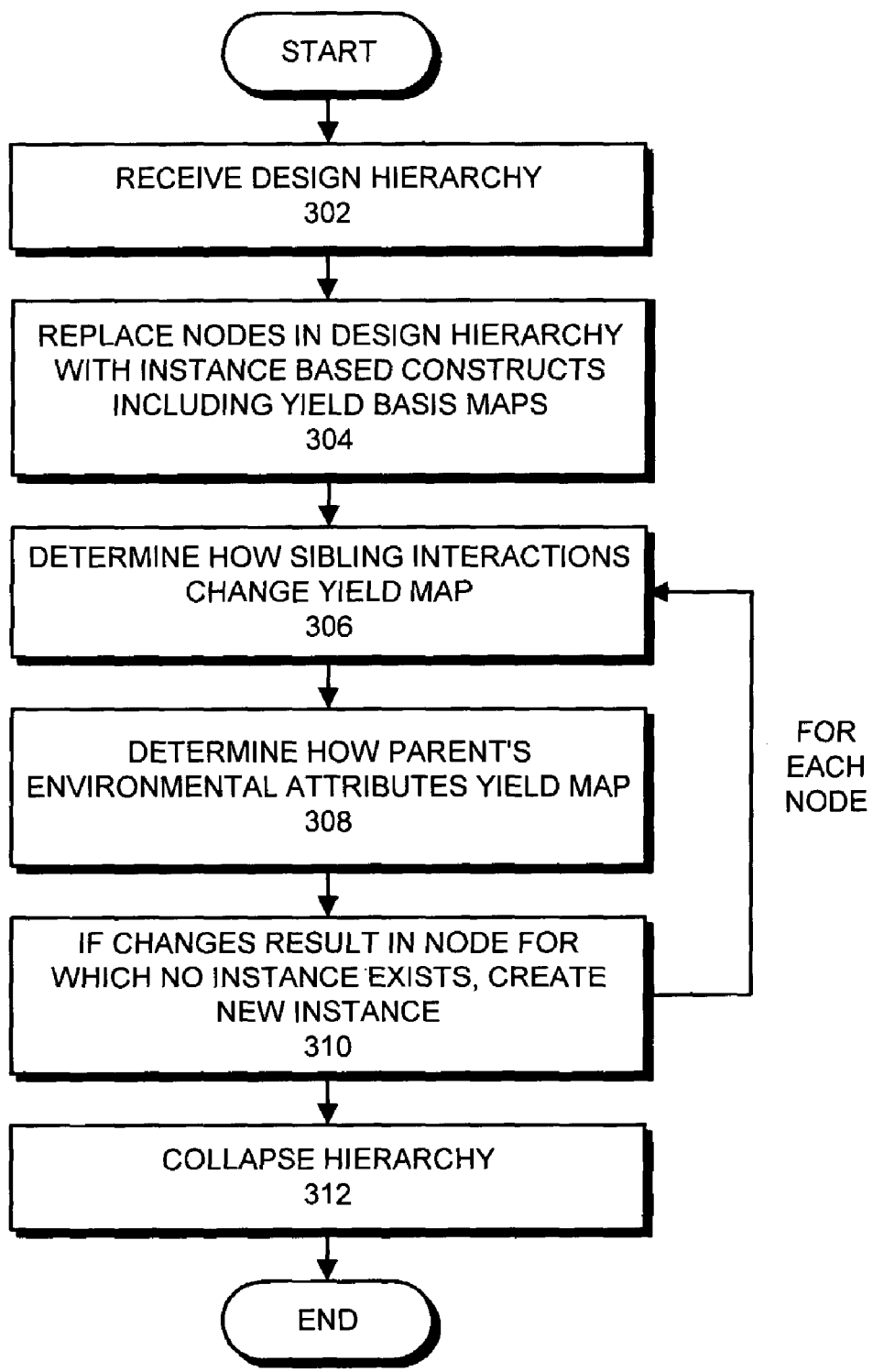
FIG. 10 is a flow chart illustrating the process of generating an instance-based representation from a hierarchical representation in accordance with an embodiment of the invention.

FIG. 10 is a flow chart illustrating the process of generating an instance-based representation from a hierarchical representation in accordance with an embodiment of the invention including yield map data for instances. The process starts by receiving a design hierarchy specifying the layout of the circuit (step 302). The system then replaces nodes in the design hierarchy as is illustrated in FIG. 8B (step 304).

Next, for each node in the design hierarchy, the system determines how interactions with siblings change the layout and yield map of the node (step 306). For example, a geometrical feature within a sibling node may cause a coloring conflict, a design rule violation, or an increased probability of failure due to manufacturing defects that has to be remedied by modifying the layout of the node. The system also determines how the parent's environmental attributes change the layout and yield map data (step 308). For example, in FIG. 9 a geometrical feature 402 defined within parent node 200 may cause a coloring conflict, a design rule violation, or an increased probability of failure due to manufacturing defects that must be remedied by changing the layout of the node. Finally, if any of these changes result in a new instance for which no instance has been created, the system creates a new instance (step 310).

In one embodiment of the invention, during the above-described process, the nodes are visited in topological order. This ensures that all instances of a parent node are created before a child node is analyzed.

In one embodiment of the invention, all instances of a master cell are generated before going on to the next cell.

Next, the design hierarchy is collapsed to merge holding cells that contain only a single physical cell into a single physical cell (step 312). This is not shown, however the instance-based representation would be similar to FIG. 8B with the appropriate holding and physical cells merged.

Note that an instance-based representation will not necessarily reduce the amount of layout that must be considered during subsequent analysis operations—however, the instance-based representation enables parallel processing of layouts. For example, if instances are not repeated in a layout, using an instance-based representation does not reduce the total layout area that must be analyzed. Therefore, it may be more efficient to use other representations for yield map generation, including expanded hierarchical representations and flat representations, in some situations.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for providing an estimate of yield for a device in a fabrication facility, the device having a layout including a pattern characterizable by a combination of members of a set of basis shapes, comprising:

providing a set of basis pre-images in a machine readable storage medium, the basis pre-images in the set including yield map data representing an interaction of respective members of the set of basis shapes with a defect model;

reading and combining using a data processor, basis pre-images corresponding to basis shapes in said combination of members of said set of basis shapes to provide a combination result; and outputting said combination result.

2. The method of claim 1, wherein said providing includes:

storing a library of basis pre-images, basis pre-images in the library comprising yield map data for a subset of basis shapes in said combination of members.

3. The method of claim 1, wherein said basis pre-images comprise results of convolution of the defect model with respective basis shapes.

4. The method of claim 1, wherein said basis pre-images comprise combined results of a plurality of convolutions or linear operations for respective basis shapes.

5. The method of claim 1, wherein said layout comprises a plurality of patterns characterizable by respective combinations of members of said set of basis shapes, and including reading and combining using a data processor, basis pre-images corresponding to basis shapes in said respective combinations of members of said set of basis shapes to provide respective combination results; and combining said respective combination results to produce two-dimensional yield map data for said device; and outputting said yield map data in a machine readable format.

6. The method of claim 1, wherein said defect model comprises information about a defect, including one or more of defect size, defect shape and defect probability distribution parameters.

7. The method of claim 1, wherein said providing includes:

storing a library of basis pre-images, basis pre-images in the library comprising yield map data for corresponding basis shapes; and determining for a particular basis shape in said combination, whether a basis pre-image corresponding to the particular basis shape is included in said library, and if not, then computing a basis pre-image in response to said defect model and said particular basis shape.

8. The method of claim 1, including extracting from said layout a combination of basis shapes that characterize said pattern.

9. The method of claim 1, wherein said layout comprises layout file including data defining respective layout features of said layout, and including identifying said pattern, the identifying including accessing a particular layout feature in the layout from said layout file;

defining a halo region, the halo region having an inner perimeter, the inner perimeter of the halo region being defined by the outer perimeter of the particular layout feature, and the outer perimeter being spaced away from said inner perimeter by a distance related to the defect model;

determining whether another layout feature in said layout file intersects, or other layout features in said layout file intersect, said halo region, if so, identifying a combination of the particular layout feature and said other feature or features as said pattern.

10. The method of claim 1, wherein said layout comprises a hierarchical layout file including nodes and links, the nodes including data defining respective layout features of said layout, and including identiting said pattern, the identifying including accessing a node in said layout file for a particular layout feature in the layout;

defining a halo region, the halo region having an inner perimeter, the inner perimeter of the halo region being defined by the outer perimeter of the particular layout feature, and the outer perimeter being spaced away from said inner perimeter by a distance related to the defect model;

determining whether another layout feature in said layout file intersects, or other layout features in said layout file intersect, said halo region, if so, identifying a combination of the particular layout feature and said other feature or features as said pattern; and creating a node in said hierarchy for said pattern including said combination result.

11. A data processing system providing an estimate of yield for a device in a fabrication facility, the device having a layout including a pattern characterizable by a combination of members of a set of basis shapes, including:

a data processor; and a memory system, in communication with the data processor, the memory system storing a design database characterizing said layout, and storing programs of instruction executable by the data processor, the programs of instruction including logic to provide a set of basis pre-images, the basis pre-images in the set including yield map data representing an interaction of respective members of the set of basis shapes with a defect model; logic to read and combinebasis pre-images corresponding to basis shapes in said combination of members of said set of basis shapes to provide a combination result; and logic to store said combination result.

12. The system of claim 11, wherein said memory system stores a library of basis pre-images, basis pre-images in the library comprising yield map data for a subset of basis shapes in said combination of members.

13. The system of claim 11, wherein said basis pre-images comprise results of convolution of the defect model with respective basis shapes.

14. The system of claim 11, wherein said basis pre-images comprise combined results of a plurality of convolutions or linear operations for respective basis shapes.

15. The system of claim 11, wherein said layout comprises a plurality of patterns characterizable by respective combinations of members of said set of basis shapes, and the programs of instruction include logic to read and combine basis pre-images corresponding to basis shapes in said respective combinations of members of said set of basis shapes to provide respective combination results; and logic to combine said respective combination results to produce two-dimensional yield map data for said device.

16. The system of claim 11, wherein said defect model comprises information about a defect, including one or more of defect size, defect shape and defect probability distribution parameters.

17. The system of claim 11, wherein said memory system stores a library of basis pre-images, basis pre-images in the library comprising yield map data for corresponding basis shapes; and the programs of instruction include logic to determine for a particular basis shape in said combination, whether a basis pre-image corresponding to the particular basis shape is included in said library, and if not, then to compute a basis pre-image in response to said defect model and said particular basis shape.

18. The system of claim 11, wherein the programs of instruction include logic to extract from said layout a combination of basis shapes that characterize said pattern.

19. The system of claim 11, wherein said layout comprises layout file including data defining respective layout features of said layout, and the programs of instruction include logic to identify said pattern, including logic to access a particular layout feature in the layout from said layout file;

define a halo region, the halo region having an inner perimeter, the inner perimeter of the halo region being defined by the outer perimeter of the particular layout feature, and the outer perimeter being spaced away from said inner perimeter by a distance related to the defect model; and determine whether another layout feature in said layout file intersects, or other layout features in said layout file intersect, said halo region, if so, to identify a combination of the particular layout feature and said other feature or features as said pattern.

20. The system of claim 11, wherein said layout comprises a hierarchical layout file including nodes and links, the nodes including data defining respective layout features of said layout, and the programs of instruction include logic to identify said pattern, including logic to access a node in said layout file for a particular layout feature in the layout;

define a halo region, the halo region having an inner perimeter, the inner perimeter of the halo region being defined by the outer perimeter of the particular layout feature, and the outer perimeter being spaced away from said inner perimeter by a distance related to the defect model;

determine whether another layout feature in said layout file intersects, or other layout features in said layout file intersect, said halo region, if so, to identify a combination of the particular layout feature and said other feature or features as said pattern; and create a node in said hierarchy for said pattern including said combination result.

21. An article of manufacture supporting an estimate of yield for a device in a fabrication facility, the device having a layout including a pattern characterizable by a combination of members of a set of basis shapes, comprising:

a machine readable data storage medium storing programs of instruction executable by a data processor coupled a memory system, including logic to provide a set of basis pre-images, the basis pre-images in the set including yield map data representing an interaction of respective members of the set of basis shapes with a defect model; logic to read and combine basis pre-image corresponding to basis shapes in said combination of members of said set of basis shapes to provide a combination result; and logic to store said combination result.

22. The article of claim 21, wherein said memory system stores a library of basis pre-images, basis pre-images in the library comprising yield map data for a subset of basis shapes in said combination of members.

23. The article of claim 21, wherein said basis pre-images comprise results of convolution of the defect model with respective basis shapes.

24. The article of claim 21, wherein said basis pre-images comprise combined results of a plurality of convolutions or linear operations for respective basis shapes.

25. The article of claim 21, wherein said layout comprises a plurality of patterns characterizable by respective combinations of members of said set of basis shapes, and the programs of instruction include logic to read and combine basis pre-images corresponding to basis shapes in said respective combinations of members of said set of basis shapes to provide respective combination results; and logic to combine said respective combination results to produce two-dimensional yield map data for said device.

26. The article of claim 21, wherein said defect model comprises information about a defect, including one or more of defect size, defect shape and defect probability distribution parameters.

27. The article of claim 21, wherein said memory system stores a library of basis pre-images, basis pre-images in the library comprising yield map data for corresponding basis shapes; and the programs of instruction include logic to determine for a particular basis shape in said combination, whether a basis pre-image corresponding to the particular basis shape is included in said library, and if not, then to compute a basis pre-image in response to said defect model and said particular basis shape.

28. The article of claim 21, wherein the programs of instruction include logic to extract from said layout a combination of basis shapes that characterize said pattern.

29. The article of claim 21, wherein said layout comprises layout file including data defining respective layout features of said layout, and the programs of instruction include logic to identify said pattern, including logic to access a particular layout feature in the layout from said layout file;

define a halo region, the halo region having an inner perimeter, the inner perimeter of the halo region being defined by the outer perimeter of the particular layout feature, and the outer perimeter being spaced away from said inner perimeter by a distance related to the defect model; and determine whether another layout feature in said layout file intersects, or other layout features in said layout file intersect, said halo region, if so, to identify a combination of the particular layout feature and said other feature or features as said pattern.

30. The article of claim 21, wherein said layout comprises a hierarchical layout file including nodes and links, the nodes including data defining respective layout features of said layout, and the programs of instruction include logic to identify said pattern, including logic to access a node in said layout file for a particular layout feature in the layout;

define a halo region, the halo region having an inner perimeter, the inner perimeter of the halo region being defined by the outer perimeter of the particular layout feature, and the outer perimeter being spaced away from said inner perimeter by a distance related to the defect model;

determine whether another layout feature in said layout file intersects, or other layout features in said layout file intersect, said halo region, if so, to identify a combination of the particular layout feature and said other feature or features as said pattern; and create a node in said hierarchy for said pattern including said combination result.

31. A method for providing an estimate of yield for a device in a fabrication facility, the device having a layout characterized by a hierarchical layout file, the hierarchical layout file having nodes corresponding to layout patterns in said layout, comprising:

associating with nodes in said hierarchical layout file, two-dimensional yield maps for said corresponding layout patterns.

32. The method of claim 31, including:

accessing a node in said hierarchy for a particular layout pattern including a layout feature;

defining a halo region, the halo region having an inner perimeter, the inner perimeter of the halo region being defined by the outer perimeter of the particular layout feature, and the outer perimeter being spaced away from said inner perimeter by a distance related to a defect model; and determining whether a layout pattern in a sibling node intersects said halo region, if so, modifying the yield map associated with said node based upon interactions with the layout pattern of the sibling node.

33. The method of claim 31, wherein said hierarchical layout file comprises an instance-based hierarchy, and including:

accessing a node in said hierarchy for an instance of a particular layout pattern;

determining whether a layout pattern in a sibling node has an effect on the yield map associated with said node, and if so, providing a modified yield map to be associated with said node, the modified yield map being modified based upon interactions with the layout pattern of the sibling node; and creating a new instance of said particular layout pattern, including an association with said modified yield map.

34. The method of claim 31, wherein the layout comprises a pattern characterizable by a combination of members of a set of basis shapes, and said two-dimensional yield map comprises a combination result produced by a computer-implemented procedure, comprising:

providing a set of basis pre-images in a machine readable storage medium, the basis pre-images in the set including yield map data representing an interaction of respective members of the set of basis shapes with a defect model; and reading and combining using a data processor, basis pre-images corresponding to basis shapes in said combination of members of said set of basis shapes to provide said combination result.

35. The method of claim 31, including:

collapsing said hierarchy to produce a two-dimensional yield map for said layout.

36. The method of claim 31, wherein said layout comprises a layout of a complete layer of an integrated circuit, and including:

collapsing said hierarchy to produce a two-dimensional yield map for said integrated circuit module.

37. A method for providing an estimate of yield for an integrated circuit device in a fabrication facility, the device having a layout characterized by an instance-based layout file, the instance-based layout file having nodes corresponding to layout patterns in said layout, comprising:

associating with nodes in said instance-based layout file, instances of two-dimensional yield maps for said corresponding layout patterns.

38. The method of claim 37, including:

accessing a node in said layout file for an instance of a particular layout pattern;

determining whether a layout pattern in another node has an effect on the yield map associated with said node, and if so, providing a modified yield map associated with said node, the modified yield map being modified based upon interactions with the layout pattern of the other node; and creating a new instance of said particular layout pattern, including an association with said modified yield map.

39. The method of claim 37, wherein the layout comprises a pattern characterizable by a combination of members of a set of basis shapes, and said two-dimensional yield map comprises a combination result produced by a computer-implemented procedure, comprising:

providing a set of basis pre-images in a machine readable storage medium, the basis pre-images in the set including yield map data representing an interaction of respective members of the set of basis shapes with a defect model; and reading and combining using a data processor, basis pre-images corresponding to basis shapes in said combination of members of said set of basis shapes to provide said combination result.

40. The method of claim 37, including:

collapsing said layout file to produce a two-dimensional yield map for said layout.

41. The method of claim 37, wherein said layout comprises a layout of a complete layer of an integrated circuit, and including:

collapsing said layout file to produce a two-dimensional yield map for said layout.

42. A data processing system providing an estimate of yield for a device in a fabrication facility, the device having a layout including a pattern characterizable by a combination of members of a set of basis shapes, including:

a data processor; and a memory system, in communication with the data processor, the memory system storing a design database characterizing said layout, characterized by a layout file, the layout file having nodes corresponding to layout patterns in said layout, and including two-dimensional yield maps for said corresponding layout patterns.

43. The system of claim 42, wherein the memory system stores programs of instruction executable by the process, including logic to:

access a node in said layout file for a particular layout pattern including a layout feature;

define a halo region, the halo region having an inner perimeter, the inner perimeter of the halo region being defined by the outer perimeter of the particular layout feature, and the outer perimeter being spaced away from said inner perimeter by a distance related to a defect model; and determine whether a layout pattern in another node intersects said halo region, if so, modify the yield map associated with said node based upon interactions with the layout pattern of the other node.

44. The system of claim 42, wherein said layout file comprises an instance-based hierarchy, and the programs of instruction include logic to:

access a node in said hierarchy for an instance of a particular layout pattern;

determine whether a layout pattern in a sibling node has an effect on the yield map associated with said node, and if so, provide a modified yield map to be associated with said node, the modified yield map being modified based upon interactions with the layout pattern of the sibling node; and create a new instance of said particular layout pattern, including an association with said modified yield map.

45. The system of claim 42, wherein the layout comprises a pattern characterizable by a combination of members of a set of basis shapes, and said programs of instruction include logic to produce the two-dimensional yield map, comprising logic to:

provide a set of basis pre-images in a machine readable storage medium, the basis pre-images in the set including yield map data representing an interaction of respective members of the set of basis shapes with a defect model; and read and combine using a data processor, basis pre-images corresponding to basis shapes in said combination of members of said set of basis shapes to provide said combination result.

46. The system of claim 42, wherein said layout file comprises a hierarchical layout file, and including logic to:

collapse said layout file to produce a two-dimensional yield map for said layout.

47. The system of claim 42, wherein said layout comprises a complete layer of an integrated circuit, and including:

collapsing said layout file to produce a two-dimensional yield map for said layout.

\* \* \* \* \*